(12) United States Patent
Reiderman

(10) Patent No.: US 11,686,694 B2
(45) Date of Patent: *Jun. 27, 2023

(54) NUCLEAR MAGNETIC RESONANCE SYSTEMS AND METHODS FOR CHARACTERIZATION OF BOREHOLE MATERIALS

(71) Applicant: Arcady Reiderman, Richmond, TX (US)

(72) Inventor: Arcady Reiderman, Richmond, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/897,346

(22) Filed: Aug. 29, 2022

(65) Prior Publication Data

US 2023/0074144 A1 Mar. 9, 2023

Related U.S. Application Data

(63) Continuation of application No. 16/004,426, filed on Jun. 11, 2018, now Pat. No. 11,460,420.

(60) Provisional application No. 62/520,872, filed on Jun. 16, 2017.

(51) Int. Cl.
```
G01N 24/08     (2006.01)
G01R 33/30     (2006.01)
G01R 33/483    (2006.01)
```
(52) U.S. Cl.
CPC ......... *G01N 24/081* (2013.01); *G01R 33/307* (2013.01); *G01R 33/4835* (2013.01)

(58) Field of Classification Search
CPC . G01N 24/081; G01R 33/307; G01R 33/4835
See application file for complete search history.

(56) References Cited

U.S. PATENT DOCUMENTS

| | | | | |
|---|---|---|---|---|
| 4,885,540 A * | 12/1989 | Snoddy | .................... | G01V 3/32 |
| | | | | 324/303 |
| 5,525,904 A * | 6/1996 | Hanley | ................. | G01R 33/383 |
| | | | | 324/303 |
| 6,268,726 B1 * | 7/2001 | Prammer | ............. | G01N 24/081 |
| | | | | 324/309 |
| 8,004,279 B2 * | 8/2011 | Kruspe | .................... | G01V 3/32 |
| | | | | 324/306 |
| 11,422,283 B1 * | 8/2022 | Reiderman | .............. | G01V 3/34 |
| 11,460,420 B2 * | 10/2022 | Reiderman | ........... | G01N 24/081 |
| 2006/0272812 A1 * | 12/2006 | Yu | ........................ | G01N 24/081 |
| | | | | 166/252.5 |
| 2018/0081077 A1 * | 3/2018 | Chen | ..................... | G01N 24/081 |

* cited by examiner

*Primary Examiner* — Reena Aurora
(74) *Attorney, Agent, or Firm* — Pierson Intellectual Property LLC

(57) ABSTRACT

An apparatus (and method) for automated NMR relaxation measurements on borehole materials (e.g., drill cuttings, sidewall cores and whole cores) includes a sample cassette and a sample transfer system operating synchronized with the NMR experiment. The apparatus implements an automatic calibration, adaptive data stacking and automated measurements of the sample volume for irregular shaped samples. The measurements throughput may be increased by creating more than one excitation/detection volume during a measurement cycle. The NMR surface data may be interpreted together with other bulk sensitive measurement data (e.g. natural gamma ray spectroscopy) or/and downhole data to evaluate earth formations while drilling an oil well.

17 Claims, 12 Drawing Sheets

NUCLEAR MAGNETIC RESONANCE SYSTEMS AND METHODS FOR CHARACTERIZATION OF BOREHOLE MATERIALS

CROSS-REFERENCE TO RELATED APPLICATIONS

This application is related to a provisional patent application claiming the benefit USC 119(e). The provisional patent application number is U.S. 62/520,872; filing date is Jun. 16, 2017.

STATEMENT REGARDING FEDERALLY SPONSORED RESEARCH OR DEVELOPMENT

Not applicable.

BACKGROUND OF THE INVENTION

This invention relates to a low frequency nuclear magnetic resonance (NMR) for the oil bearing earth formations evaluation purposes. More specifically the invention applies to the NMR measurement performed on the surface, in particular, on the well site in order to support drilling processes.

Low frequency NMR relaxation measurements are performed as apart of earth formations evaluation during and after drilling an oil well. The measurement can be performed downhole and on the surface at the well site or in a laboratory. This invention relates to the surface NMR measurements on borehole materials. The materials may include continuous drill core (whole core or core segments), rotary sidewall cores, core stacks, core plugs, individual hand specimens, bulk samples, unwashed cuttings, washed and dried cuttings, microcores and others.

Surface NMR relaxation measurements are typically conducted in laboratory using a standard or specialized NMR relaxometer that includes a permanent magnet that generates a static magnetic field and an NMR antenna generating a radio-frequency (RF) magnetic field that is perpendicular to the static magnetic field. The static magnetic field aligns nuclei in a sample with the direction of the static magnetic field. The rate at which the bulk magnetization is established is described by a spin-lattice relaxation (also called longitudinal relaxation) characterized by a time constant T1. The RF magnetic field is typically applied in a form of a sequence of RF pulses (e.g., a standard CPMG pulse sequence) to produce a sequence of spin echoes. The amplitudes of the spin echoes produced by a standard CPMG pulse sequence make points of a spin-spin relaxation curve (also called transversal relaxation curve) characterized by a time constant T2. The total amplitude of the relaxation curve and the distribution of the relaxation times T2 and T1 are the NMR properties that can be interpreted to relate them to petrophysical parameters of the borehole materials, e.g. porosity, pore size distribution, amount of bound and free fluids in the pore space, wettability of the pore surface, and others.

The NMR relaxation measurements on borehole materials are a low frequency NMR relaxometry. It intends to match a 0.4 Mhz-2 Mhz frequency range of typical downhole NMR measurement so the downhole and surface NMR measurements can complement each other.

Typically, the NMR relaxometry is performed in a core laboratory on core plugs or whole cores manually loaded in a sample holder. Partly automated measurements on continuous whole cores are addressed in U.S. Pat. Nos. 4,885,540 and 5,525,904. Some aspects of NMR measurements on drill cutting and the NMR data interpretation are disclosed in US20060272812A1 (using NMR measurements on drill cuttings to assess permeability of earth formations) and US20180081077A1 (joint interpretation of the surface NMR data and the downhole NMR data for unconventional gas reservoirs).

The existing configurations of apparatus and methods do not address functionality desired for cost efficient, high throughput automated measurements, in particular, at the well-site including measurements on drill cuttings to support the drilling process.

Therefore, there is a need for the efficient surface NMR measurement apparatus and methods that address the above-mentioned deficiencies of the existing low frequency NMR relaxometry.

BRIEF SUMMARY OF THE INVENTION

One aspect of the present invention is an apparatus to conduct automated bulk sensitive measurements on a sample of a borehole material. The apparatus comprises a sensing unit having a sensitivity area, a sample cassette loaded with a batch of samples of the borehole material to be analyzed and a sample transfer unit to automatically move the sample in and out of the sensitivity area. The apparatus preferably has at least one sample containing a known substance to be used for automatic calibration of the apparatus. One sample in the batch may be a drilling mud sample. The apparatus may include an auxiliary sensor to measure at least one of (i) weight, (ii) volume and (iii) density of the borehole material in the sample. In a preferred embodiment the sensing unit is a NMR sensing unit to acquire NMR relaxation data, the sensing unit comprising a source of a radio-frequency magnetic field in a form of a sequence of RF pulses having a waiting time between the sequences and a source of a static magnetic field. The sample transfer unit is used for at least one of (i) placing at least one sample in the sensitive area and (ii) periodically move the sample between two sensitivity areas during the waiting time to enable two-region NMR measurements in one measurement cycle and therefore increase the measurement throughput. The NMR sensing unit may define an NMR detection region, which is selected by selecting a spatial distribution of the radio-frequency magnetic field or selecting a frequency bandwidth of the radio-frequency magnetic field and a gradient of the static magnetic field. In another embodiment of the apparatus the sensing unit is a natural gamma spectroscopy sensing unit to acquire natural gamma-ray spectroscopy data, in particular, the concentrations of U (Uranium), Th (Thorium) and K (Potassium) in the borehole material.

Another aspect of the present invention is a method for an automated NMR measurement on a sample of a borehole material, comprising: providing a NMR sensing unit generating a radio-frequency magnetic field and a static magnetic field, automatically transferring the sample into a sensitivity area of the sensing unit, determining a sample sensitivity volume affected by the measurement, acquiring NMR data from the sample sensitivity volume and using the data to characterize earth formations while drilling an oil well. The method may include selecting the sample sensitivity volume by selecting one of (i) spatial distribution of the radio-frequency magnetic field and (ii) frequency spectrum bandwidth of the radio-frequency magnetic field in relation to a gradient of the static magnetic field. The method may also include measuring a volume of the whole sample, having an unknown irregular shape. Measuring the volume of the sample may comprise filling a sample container with a fluid, determining the volume of the fluid based on an NMR signal and subtracting the volume of the fluid from the volume of the container. Alternatively, the method may include acquiring a magnetic resonance image of the sample to determine the volume of the sample. Yet another way to assess the volume may include measuring weight of the sample and carrying out its bulk density scan. The method may include performing adaptive data stacking until either a desired signal-to-noise ratio of the data or a time limit for the measurement is reached. The method may also include an on-the-fly frequency tuning using the sample to be analyzed. The method may further include switching between two sensitivity areas to enable two-region NMR measurements in one measurement cycle and therefore increase the measurement throughput. The method may also include joint interpretation of at least two of (i) surface NMR data obtained on borehole materials, (ii) downhole NMR data, (iii) surface natural gamma-ray spectroscopy data obtained on borehole materials and (iv) downhole natural gamma-ray data to characterize earth formations while drilling an oil well.

Yet another aspect of the present invention is a method for NMR measurement on a whole core. The method includes the steps of generating a radio-frequency magnetic field in a form of sequences of radio-frequency pulses having a waiting time between the sequences and generating a static magnetic field, the radio-frequency magnetic field and the static magnetic field determine a sensitivity volume affected by the NMR measurement. The method also includes switching between at least two sensitivity volumes during the waiting time to enable at least two-region NMR measurements in one measurement cycle and therefore increase the measurement throughput. The method further includes repeating the measurement cycles at different positions on the core to produce a one-dimensional image of the NMR relaxation properties of the core.

BRIEF DESCRIPTION OF THE DRAWINGS

For a detailed description of the embodiments of the invention, reference will now be made to the accompanying drawing in which like numerals refer to like elements. The drawings are included to illustrate certain aspects of the present disclosure and should not be viewed as exclusive embodiments. The subject matter disclosed is capable of considerable modifications, alterations, combinations, and equivalents in form and function, without departing from the scope of this disclosure.

DETAILED DESCRIPTION OF THE INVENTION

Embodiments of this disclosure are directed to NMR relaxation measurements conducted on borehole materials including continuous drillcore, rotary sidewall cores, core stacks, core plugs, individual hand specimens, bulk samples, unwashed cuttings, washed and dried cuttings, micro-cores and others.

Figure 1A:
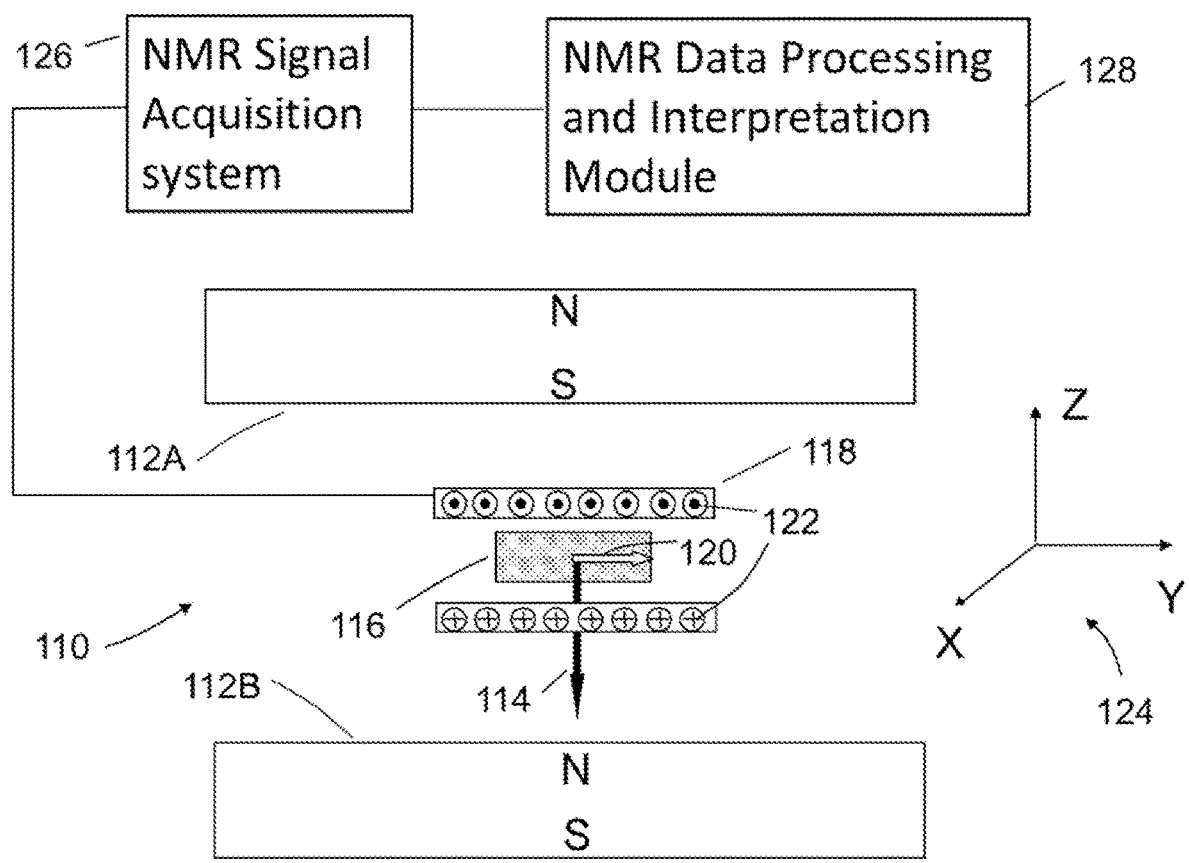
FIG. 1A and FIG. 1B show an exemplary embodiment of a low field NMR relaxometer without and with a sample transfer system.

FIG. 1A shows some general components of an NMR relaxometer that are present in disclosed embodiments. It includes a sensing unit 110 comprising a permanent magnet assembly shown in a form of two magnet pieces 112A and 112B magnetized in the same direction. The magnet assembly generates a static magnetic field 114 (either substantially homogeneous or gradient magnetic field) in a sample 116. An NMR antenna 118 generates a radio-frequency (RF) magnetic field 120 in the sample 116. The sample may have a cylindric shape and the coil may be a solenoid coaxial with the axis of the sample. Direction of RF current in the antenna wire is shown at 122. The NMR antenna 118 may be used for both generating the RF magnetic field in the sample and receiving NMR signals from the sample. In the Cartesian coordinate system shown at 124 the static magnetic field is in Z-direction, the RF magnetic field and the sensitivity direction of the RF antenna is in Y-direction. The NMR antenna 118 is connected to the NMR signal acquisition system 126. The acquisition system supplies the RF current in a form of an NMR pulse sequence when exciting NMR in the sample and receives NMR signals emanating from the sample in response to the NMR pulse sequence. The magnet assembly 112A, 112B is preferably configured to generate the static magnetic field 114 in vertical direction (Z-direction) to make the field measurement insensitive to positioning of the sensing unit 110 on a horizontal plane: rotating the magnet assembly while keeping magnetic field vertical does not change the angle of the magnetic field with respect to the Earth's magnetic field.

NMR data processing and interpretation module 128 is used to process the received NMR signals and invert the processed data for NMR parameters that can be related to petrophysical properties of the sample.

Figure 1B:
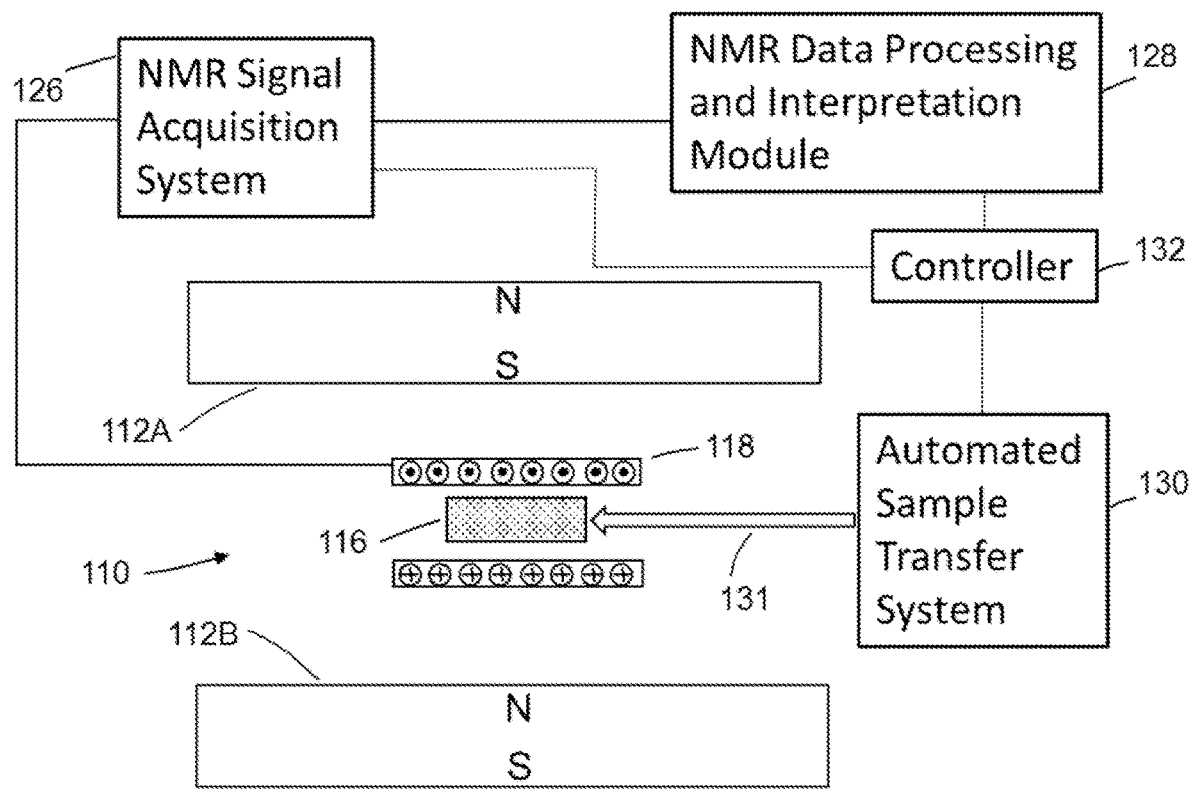

FIG. 1B depicts an embodiment of an automated version of NMR relaxometer. The automated version additionally comprises automated sample transfer system 130, an actuator 131 and a controller 132 that provides controls of the other systems and modules of the relaxometers (FIG. 1B). The sample transfer system 130 may comprise a cassette where a batch of sample is loaded, guides, motors and other mechanical and electromechanical means (not shown in FIG. 1B). The actuator 131 may be embodied as a retractable part to reduce the footprint of the relaxometer.

Figure 2A:
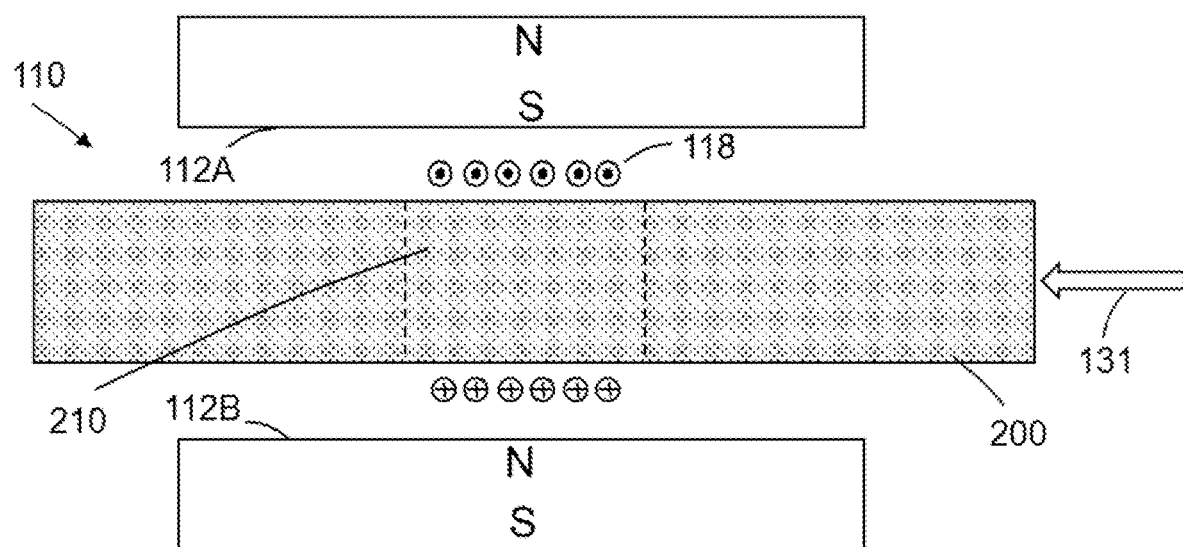
FIG. 2A, FIG. 2B and FIG. 2C show partial views of the low field NMR relaxometer illustrating three ways to define sensitivity volume for a long continuous sample or stack of samples.
Figure 2B:
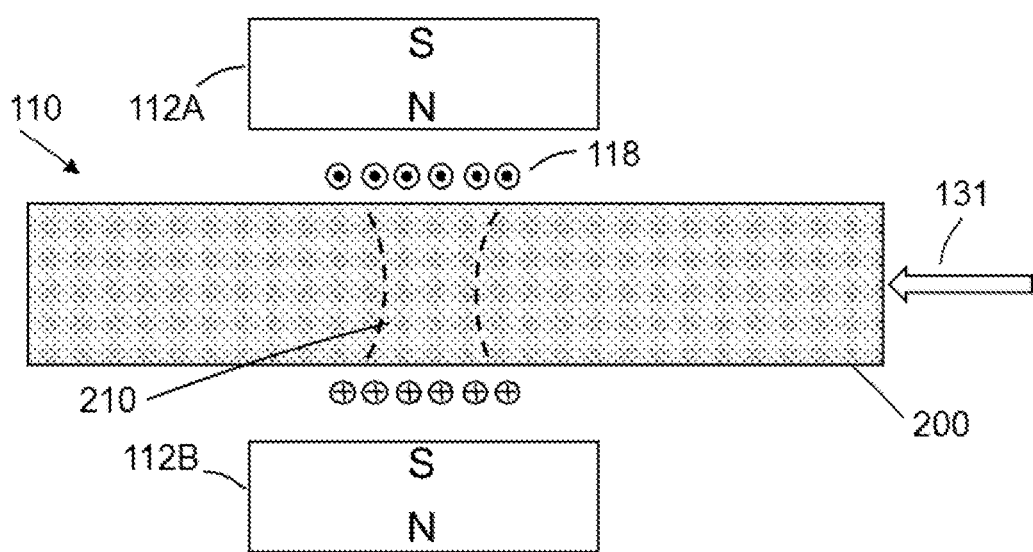
Figure 2C:
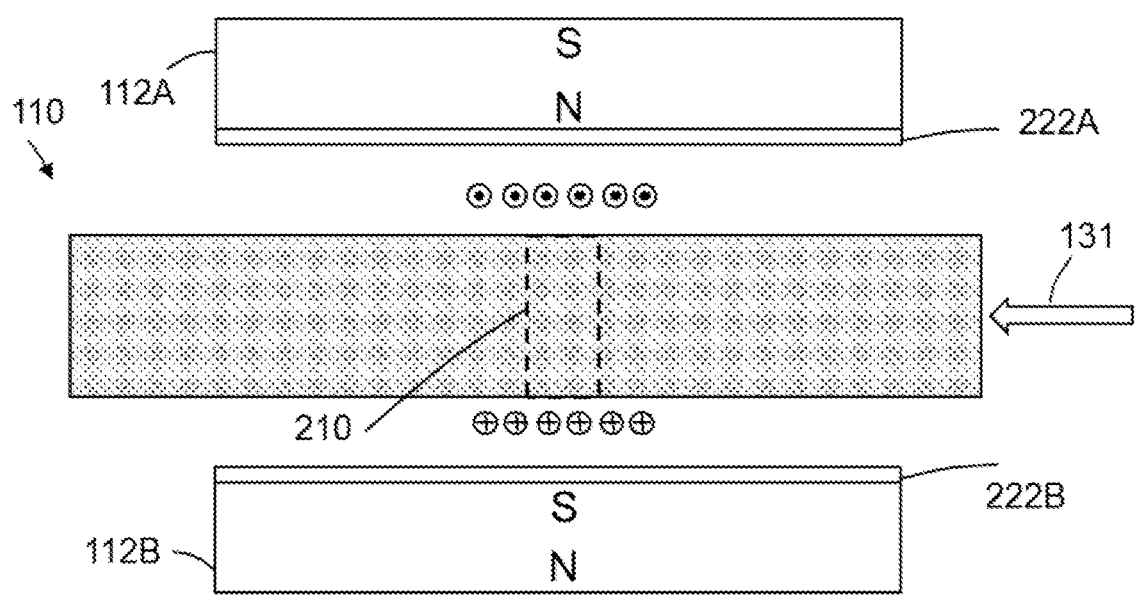

FIG. 2A, FIG. 2B, and FIG. 2C illustrate partial views (the sensing unit 110 in FIG. 1A and FIG. 1B) of the NMR relaxometer illustrating three ways to select an NMR sensitivity volume of a sample. The volume selection may be needed, for example, when a long continuous sample (e.g., a whole core) is scanned to produce a one-dimensional image of NMR relaxation properties of the core. In some cases, a volume selection may be used to define measurement volume in irregular shaped samples (e.g., individual or a stack of sidewall cores with irregular shaped ends). The volume selection may also be needed, for example, when a stack of closely spaced samples is placed in the NMR sensing area. In this case the volume selection is needed to avoid getting NMR signals form adjacent samples. FIG. 2A illustrates an embodiment, in which the sensitivity volume 210 (the dashed lines show approximately the boundaries of the sensitivity volume) is selected by the RF magnetic field. The static magnetic field of the magnet assembly 112A, 112B is homogeneous over a long axial region. The longer homogeneity region of the static magnetic field may be required in order to ensure that the nuclei have enough time to get polarized in the static magnetic field during moving sample into the sensitivity area of the sensing unit). The axial extent of the sensitivity volume 210 is substantially determined by the RF magnetic field localization, which is approximately equal the axial extent of the NMR antenna 118 (the antenna aperture) or to the diameter of the NMR antenna, whichever is greater. The sample 200 may be axially transferred either manually or automatically.

FIG. 2B illustrates an embodiment, in which the sensitivity volume 210 (the dashed lines show the boundaries of the sensitivity volume) is selected by the static magnetic field of the magnet assembly 112A, 112B. The center of the sensitivity region is where a zero-gradient point (a saddle point) is located. Due to inhomogeneity of the static magnetic field the magnetic field and therefore the excitation (Larmor) frequency change. Only the nuclei with the Larmor frequencies that are substantially within the frequency band of the RF magnetic field get excited. In case of a standard pulsed NMR excitation, (for example, when a CPMG excitation pulse sequence is used) the excitation frequency band is determined by the expression (1)

$$\omega_0 - \frac{1}{2 \cdot \tau_R} \leq \omega \leq \omega_0 + \frac{1}{2 \cdot \tau_R} \qquad (1)$$

where $\tau_R$ is the pulse width of the refocusing RF pulse of the CPMG pulse sequence; $\omega_0$ is the Larmor frequency at the saddle point of the static magnetic field. The spatial region in which the Larmor frequencies satisfy the inequality (1) makes the sensitivity volume 210 (the boundaries of the sensitivity volume may look as the ones shown by the dashed lines in FIG. 2B). The radial extent of the sensitivity volume may be smaller than the radius of the continuous sample 200. The radial and the axial extent of the sensitivity volume may be controlled by changing the width $\tau_R$ of RF magnetic field pulse. Therefore, radial and axial images can be performed by varying the pulse width of the RF pulse and moving the sample. The sensing unit according to the FIG. 2B preferably uses a relatively short, and, therefore, relatively light and inexpensive magnet assembly. The RF magnetic field in the sensitivity volume may or may not be homogeneous. In the latter case the sensitive volume is also affected by the RF magnetic field inhomogeneity. Both static and RF inhomogeneity may mimic the measurement conditions that are typical for downhole measurements. This may help when a combination of downhole NMR measurements and the surface NMR measurements on the borehole materials is used for the formation evaluation purposes.

FIG. 2C illustrates an embodiment where the sensitivity volume is also selected by the static magnetic field inhomogeneity. Unlike for the case presented in FIG. 2B the static magnetic field in FIG. 2C has a substantially uniform axial gradient of the static magnetic field. The gradient may be produced by inserts 222A and 222B. In this case a radially uniform slice (sensitivity volume 210) is selected by the static magnetic field (the boundaries of the slice are shown by the dashed lines in FIG. 2C). The Larmor frequencies within the sensitivity volume also satisfy the inequality (1). The thickness $\Delta y$ of the slice can be presented as (equation (2))

$$\Delta y \approx \frac{2\pi}{\tau_R} \cdot \frac{1}{\gamma \cdot G} \qquad (2)$$

where $\gamma$ is the gyro-magnetic ratio for the nuclear spins (typically hydrogen nuclei for most of the cases of the earth formations evaluation purposes); G is the gradient of the static magnetic field. The thickness of the slice can be controlled by either changing the RF pulse width or by changing the gradient. An axial position of the slice may be controlled by changing the frequency of the RF pulse or by adding homogeneous magnetic field that can be also produced by the inserts 222A and 222B. The gradient static magnetic field and the additional static magnetic field may be produced, for example, by a set of coils driven by a direct current (DC) source. In addition, controlling the excitation slice thickness and position can be used to generate one dimensional (axial) image of the sample. A fast, axial image can be used to find a sample boundary in case a stack of samples is used, especially when the axial extent of the samples is not well defined (e.g. side wall rotary cores having irregular shaped ends). As in the case presented in FIG. 2B the RF magnetic field in the sensitivity volume may not be homogeneous. In this case the sensitive volume is also affected by the RF magnetic field inhomogeneity. The volume selected using techniques presented in FIGS. 2A, 2B and 2C can be determined by conducting NMR measurement on a standard sample with known NMR signal per unit volume (e.g. on a water standard).

In case the sample includes liquids (e.g. a drill cuttings sample with drilling fluid, a micro-core sample with drilling fluid, a drilling fluid sample or other fluid samples) and the sample container is not fully filled with the borehole material the upper fraction of the sample may contain air which does not contribute to the NMR signal. Then a vertical gradient of the static magnetic field may be used to ensure the selected sensitive volume does not contain upper fraction of the sample.

Figure 3:
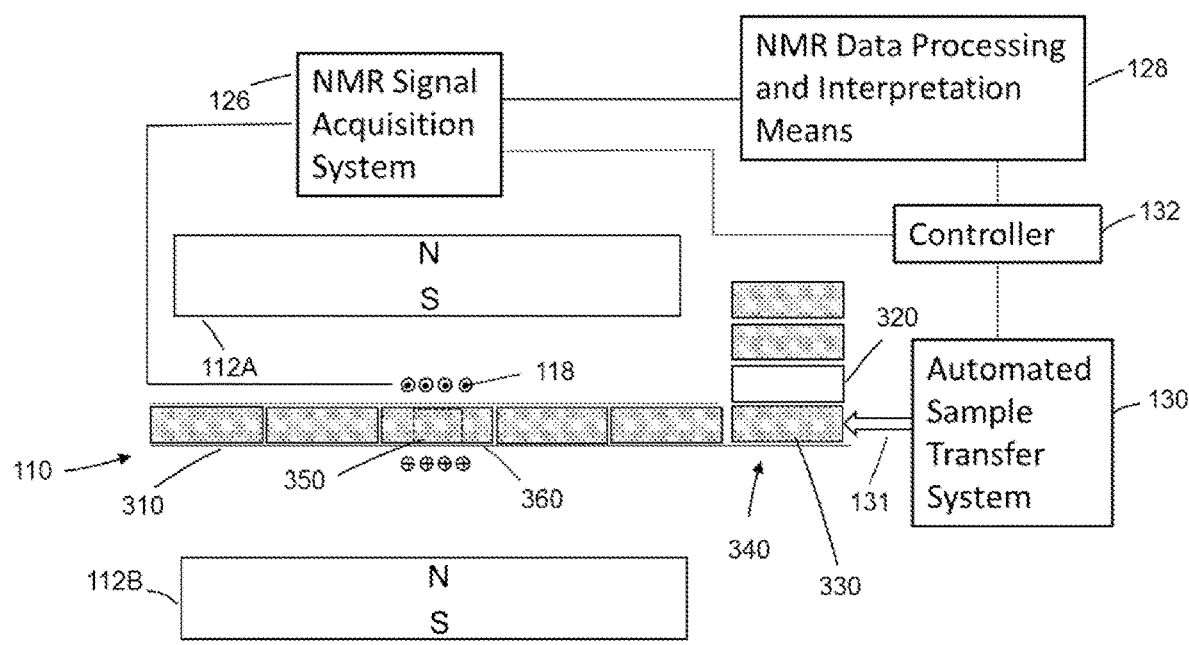
FIG. 3 represents an exemplary embodiment of the low field NMR relaxometer illustrating quasi-continuous sample feeding and the static magnetic field gradient assisted volume selection.

FIG. 3 illustrates an embodiment of the NMR relaxometer, in which a sequence of closely spaced samples (the first one is shown at 310) fed into the sensing area. This embodiment has advantage of higher throughput versus an individually transferred sample (FIG. 2) since positioning of the individual sample before one may start a measurement need to be slow enough to allow for the nuclear magnetization of the sample to establish its thermal equilibrium value. The time considered sufficient for the magnetization to establish its thermal equilibrium value (polarization time) is typically four times greater than the longitudinal relaxation time T1. Another advantage of the arrangement illustrated in FIG. 3 is that the actuator 131 needs to advance the stack of samples by a distance approximately equal to the length of a single sample container rather than by the distance approximately equal to axial dimension of the NMR sensing unit 110. Thus, the arrangement of FIG. 3 requires much smaller length of the actuator 131 and therefore reduces the footprint of the equipment, which may be critical for the on-site measurements. The set of samples loaded into the sample cassette may include an empty sample container 320 to assess a background signal (to be memorized and subtracted from the measurement data), a water standard 330 or a set of standards with different known relaxation times in order to calibrate the measurement data and the data inversion results. The set may also include a sample with known T1/T2 ratio. Additionally, the set of samples may include a drilling fluid used to drill the oil well from where the borehole material is taken. The automated NMR relaxometer of FIG. 3 comprises a sample cassette 340. The sample cassette may be arranged vertically to use gravity to assist the sample transfer as shown in FIG. 3 (at 340). It is clear that other embodiments of the sample cassette may be used. For example, horizontal cassette with spring assisted sample motion or a revolving circular cassette can be employed. The sensitive volume 350 of a sample 360 is preferably selected by a gradient of the static magnetic field or by a proper localization of the RF magnetic field to avoid NMR signal interference between adjacent samples.

Figure 4A:
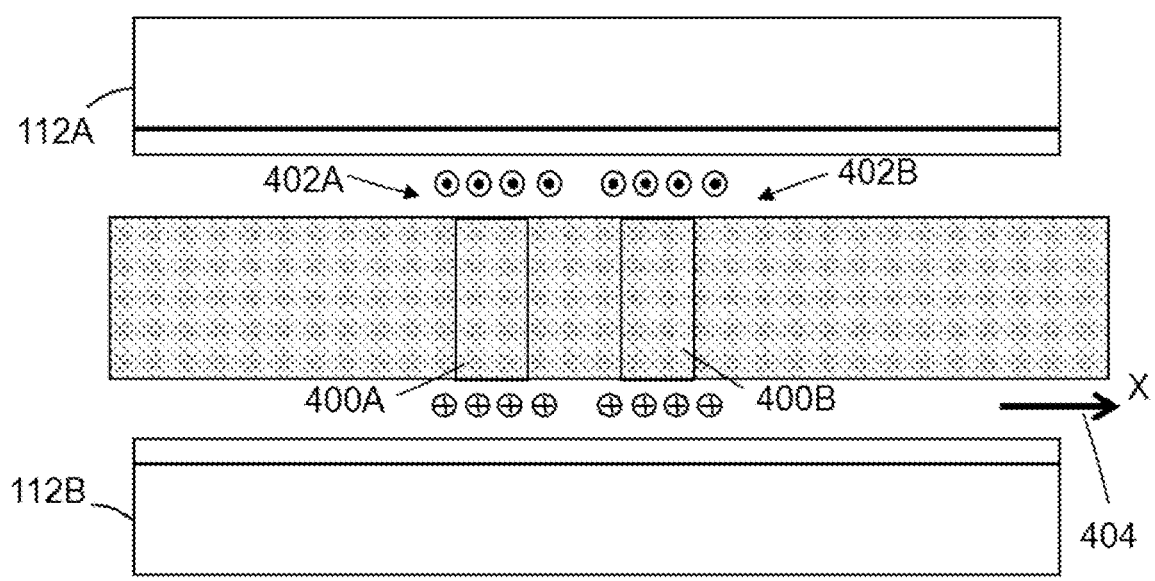
FIG. 4A, FIG. 4B and FIG. 4C illustrate embodiments of a low field NMR relaxometer with switching between at least two sensitive volumes to achieve higher throughput of measurements.
Figure 4B:
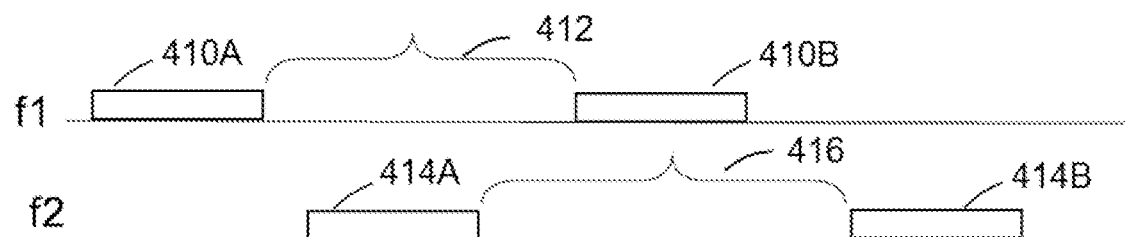
Figure 4C:
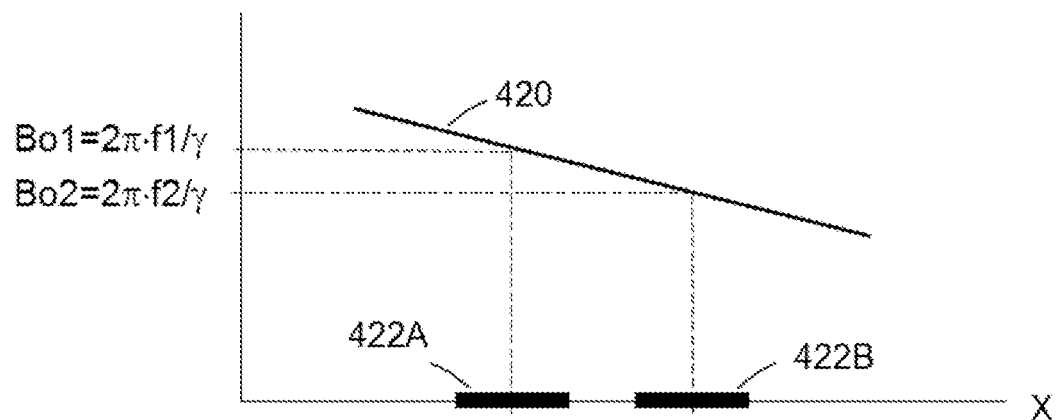

FIG. 4A, FIGS. 4B and 4C illustrate embodiments of a low field NMR relaxometer with switching between at least two sensitive volumes to achieve higher throughput of measurements.

FIG. 4A shows two sensitive volumes 400A and 400B that are selected sequentially. A standard transversal relaxation measurement NMR experiment comprises a sequence of RF pulses (CPMG sequence) followed by a waiting time needed for the nuclear magnetization to recover to its thermal equilibrium state. After the thermal equilibrium magnetization is reached (a waiting time of about four time the longest longitudinal relaxation time T1 is typically considered sufficient for the magnetization recovery) the experiment can be repeated. The repetition is typically done to increase signal-to-noise ratio (SNR) of measurement and to perform a phase cycling (a pair of CPMG pulse sequences with alternated phase of the excitation pulse is a simplest version of the phase cycling). The cycling can be used to remove outliers (e.g. constant offset and after-pulse ringing) from the NMR relaxation signals. NMR excitation at the volume 400A is performed using antenna 402A. While nuclear magnetization in the sensitive volume 400A is recovered to reach its thermal equilibrium value the NMR experiment is performed at the second sensitive volume 400B using antenna 402B. The sensitive volume 400B can be an adjacent volume of a long continuous core or a part of the neighboring core sample in case a stack of closely placed core samples is analyzed. The volume selection may be done using a static field gradient as explained above in FIG. 2C. Then switching NMR excitation between the two volumes 400A and 400B may be done by changing operating frequency of the RF pulses: the operating frequency of the antenna 402A at a frequency f1 and the operating frequency of the antenna 402B at a frequency f2. The sensitive volume switching may be also done by changing the static magnetic field while switching the NMR signal acquisition between antenna 402A and antenna 402B without changing the operating frequency.

FIGS. 4B and 4C illustrate an embodiment, in which the switching NMR excitation between the volumes are done by changing the operating frequency of the RF pulses. The transversal relaxation measurement is performed using CPMG pulse sequence, then the first CPMG sequence 410A is run at the RF frequency f1 followed by the second CPMG sequence 414A run during the waiting time 412. Then the frequency return to f1 to run the second CPMG pulse sequence 410B at the same volume during the waiting time 416. This is followed by running the CPMG sequence 414B a at the RF frequency f2 again. The train of the same frequency may be identical or have a phase alternation (phase cycling) as explained above. Changing the excitation volume when changing the RF operating frequency is illustrated in FIG. 4C showing the static magnetic field 420 as a function of axial distance X (shown at 404) of the sample. The change of the operating frequency f corresponds to the change of the static magnetic field Bo of NMR excitation according to the equation:

$$B_0 = \frac{2\pi \cdot f}{\gamma}. \tag{3}$$

($\gamma$ is the gyro-magnetic ratio of a nuclear). Therefore, due to the gradient of the static magnetic field the sensitive volume changes its position. The positions of the NMR excitation volumes corresponding to the frequencies f1 and f2 are shown at 422A and 422B respectively.

Thus, according to the technique illustrated in FIGS. 4A, 4B and 4C, the NMR relaxation measurements are done on two samples (or two adjacent areas of a sample in case of continuous core) during one measurement cycle (comprising CPMG sequence and waiting time). This doubles the measurement throughput. Since the CPMG train duration may be (typically) four times shorter than the waiting time, the throughput may be tripled and even quadrupled by using multiple sensitive volumes. However, multiple sensitive volumes will most likely require longer magnet, multiple antennas and cause additional complexity.

Figure 5:
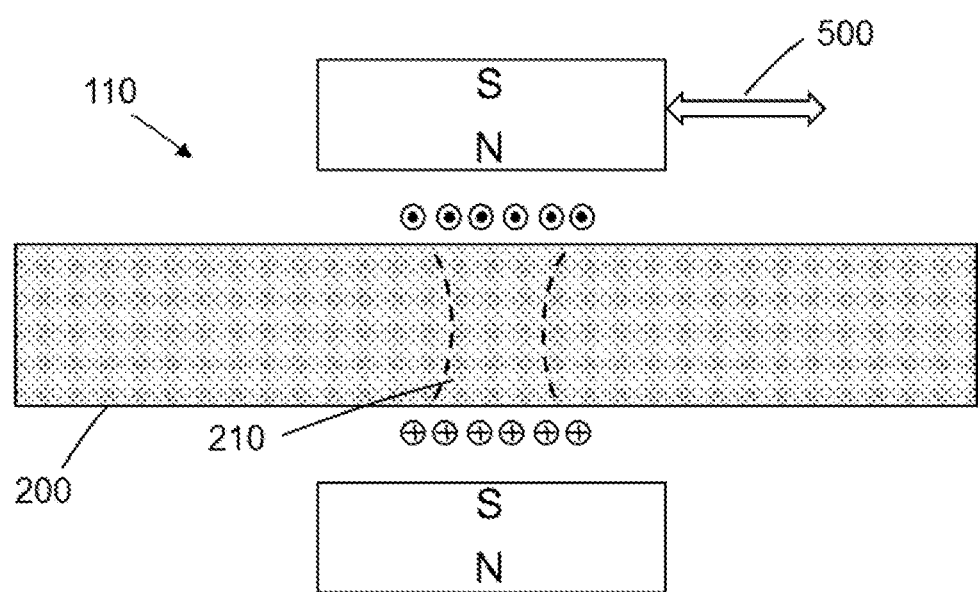
FIG. 5 illustrates another embodiment of a higher throughput measurement with switching between at least two sensitive volumes by moving sensing unit relative to the sample.

FIG. 5 illustrates another embodiment of a higher throughput measurement with switching between at least two sensitive volumes by moving sensing unit 110 relative to the sample 200. In many practical cases of NMR relaxation measurements, the waiting time is in the rage of 5-20 s (corresponding maximum expected T1). This time is sufficient to mechanically move the sensing unit 110 using an actuator 500 and move the sensing unit back to continue measurement on the same volume as need (e.g. for data stacking to increase SNR). Alternatively, the sample 200 may be moved relative to the sensing using the same actuator as the one used to transfer samples into the sensing area (e.g., the actuator shown at 131 in FIGS. 2A, 2B and 2C).

Figure 6:
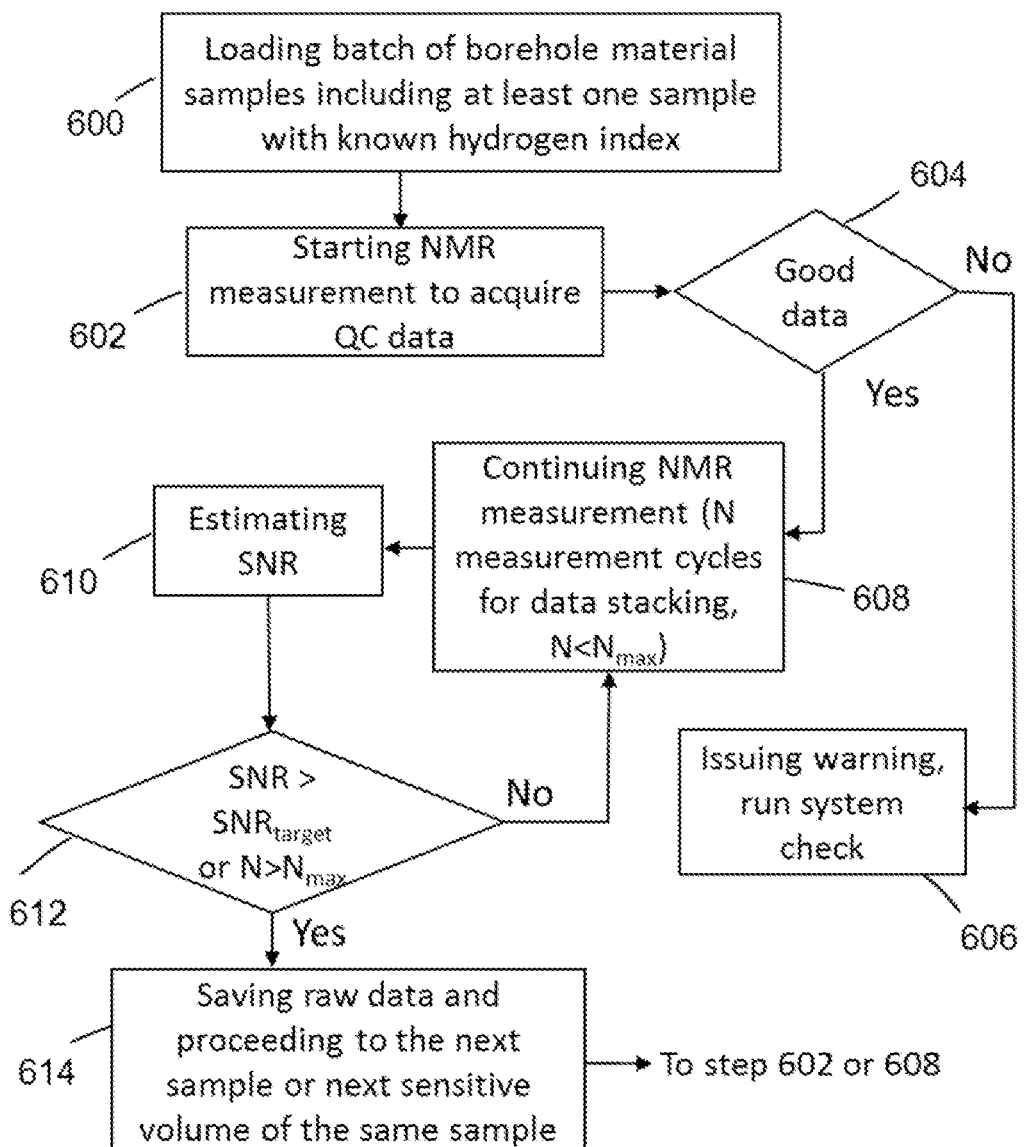
FIG. 6 illustrates a method of automated NMR data acquisition with adaptive data stacking.

FIG. 6 illustrates a method of automated NMR data acquisition with adaptive data stacking. The method comprises a step 600 of loading a batch of samples into a sample cassette with at least one sample having a known hydrogen index. This step may comprise one of the following: loading a water sample (to be used for on-the-fly calibration), an empty sample container (to measure and then subtract a background signal), a sample with known T1/T2 ratio and a sample of a drilling fluid (e.g. in case the batch of samples is the drill cuttings samples). The method further includes the step 602 of acquiring quality control (QC) data to provide an initial characterization of data quality (the step may include detecting a tuning error, electromagnetic interference, a systematic error and other indications of malfunctioning of the measurement system). The method may include a step 604 of analyzing the QC data and making decision on whether to run a comprehensive system check

606. If the QC data look satisfactory, then the standard measurements using a predetermined NMR measurement sequence (e.g. a transversal relaxation measurement sequence like CPMG or/and a combination of CPMG sequences allowing for measuring both T1 and T2 NMR relaxation times) is run (step 608 in FIG. 6). The SNR of the NMR data is then measured (step 610) and a decision is made (step 612) based on comparison of the SNR with the targeted value $SNR_{target}$ whether or not to continue repeating the experiment (step 608) for stacking the data to increase SNR (adaptive stacking). When the targeted $SNR_{target}$ is achieved or the maximum number of repeats on one sample $N_{max}$ is reached the sample measurement data are saved (step 614) and the next sample (next sample volume) is transferred to the sensitive area of the sensing unit to automatically conduct measurements on the next sample with or without repeating the steps 602, 604 and 606. The step 608 may include an on-the-fly frequency tuning and system gain measurement. The tuning and the gain measurement may be needed to increase accuracy of measurements when the measurements are run automatically for a long period of time in presence of possible thermal or other instabilities of the magnetic field of the magnet and the electronic components of the NMR signal acquisition system. The method of FIG. 6 may additionally include at least one of the following automated measurements (not shown in FIG. 6): the sample weight, the sample bulk density, and the sample volume measurements needed for the NMR data normalization.

Figure 7:
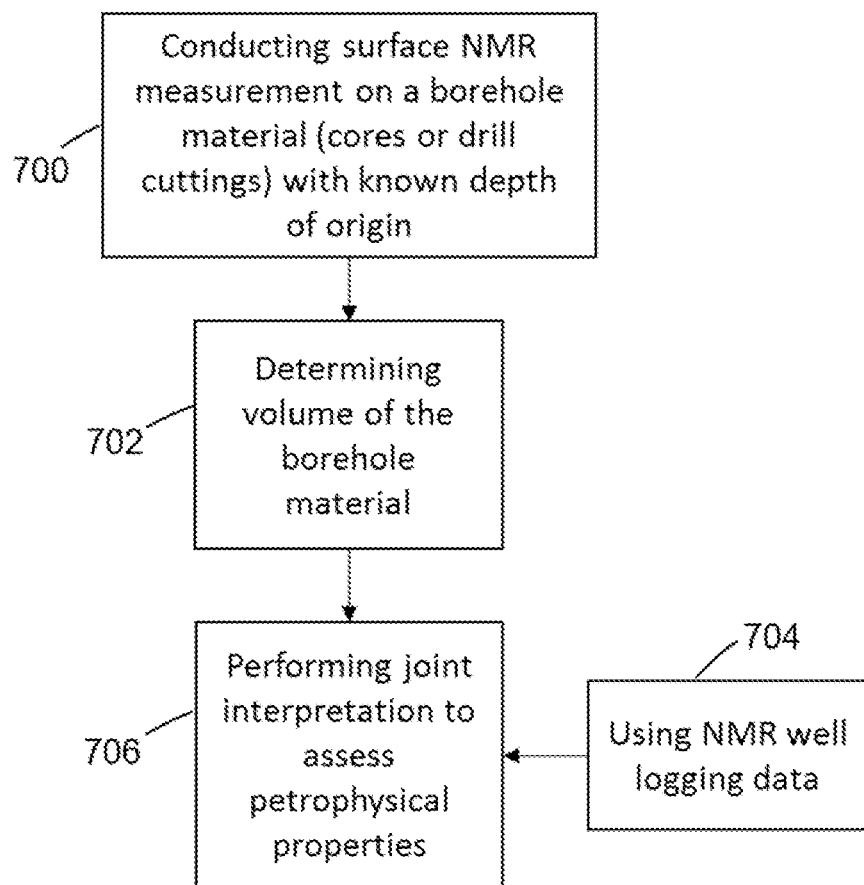
FIG. 7 illustrates a method of using surface NMR data in combination with downhole measurement data.

FIG. 7 illustrates a method of using surface NMR data in combination with downhole measurement data. The method comprises a step 700 of surface NMR measurement on a borehole material. The borehole material may be, for example, a sidewall core. The surface NMR measurements are preferably performed as high throughput automated measurements that reduce operation cost and increase reliability of measurements. The method of FIG. 7 further comprises a step 702 of the sample volume measurement. The sample volume is required to normalize the surface NMR data and calibrate the NMR signal in porosity units to compare the surface NMR data with the downhole NMR data in the same units. The surface NMR measurement are preferably conducted at a well site and may be compatible with a wireline well logging truck. In case of the surface NMR measurement on sidewall cores the cores may have irregular shaped ends, which makes it a challenge to perform a fast, automated measurement of the volume. In this case the volume measurement may be replaced by defining (selecting) the volume using a gradient static magnetic field or a localized RF magnetic field or both as explained above (FIGS. 2A, 2B and 2C). A controllable volume selection in the central area of the sample makes it insensitive to the irregular (unknown) volume near the ends. Alternatively, the volume can be measured by measuring weight of the sample and its bulk density (e.g. using gamma ray densitometry).

The method of FIG. 7 further comprises using downhole NMR data (step 704) and performing a joint interpretation (step 706) of the downhole NMR data and the surface NMR measurement data (e.g. acquired on sidewall cores). The joint interpretation may include comparison of in-situ (downhole) concentration of different fluids and residual fluids concentration in core samples based on comparison of (i) intensity of specific components of the transversal NMR relaxation spectrum acquired from calibrated surface NMR measurement and (ii) calibrated downhole NMR measurements. The comparison may provide information about relative producibility of these fluids to allow for a quick assessment of producibility of hydrocarbons residing in different parts of porosity system of the earth formations.

NMR relaxation measurements acquired using the surface NMR equipment (e.g. the apparatus presented in FIGS. 1A, 1B and FIG. 3) typically have better relaxation spectrum resolution than the downhole NMR measurements (and higher SNR too). To take advantage of the higher quality surface NMR measurements the joint interpretation may include using fast transversal relaxation components acquired from surface NMR measurements in combination with the relaxation spectrum acquired downhole, in which the faster part of the transversal relaxation spectrum may not be accessible.

One of the borehole material types used in the surface measurement of the method of FIG. 7 may be drill cuttings. Although a part of the porous structure of the drill cuttings may be damaged by the drill bit (e.g. large pores may be partly destroyed) the fluids in small pores and fluids bound to the surface of the pores (e.g., clay bound water) remain preserved and carry valuable information about the residual fluid saturation, fluids in nano-pores, wettability and permeability of the rock formations. Corresponding to these fluids is the fast fraction of the NMR transversal relaxation spectrum that can be separated from the slower part of the relaxation spectrum corresponding to the drilling fluid filling the space between the drill cuttings pieces.

The downhole NMR measurements may be either wireline measurement or measurement while drilling. Both surface and downhole NMR measurement can be accompanied by other surface and/or downhole measurements, e.g. natural gamma ray measurements. The joint interpretation may include using NMR and non-NMR measurements. For example, the natural gamma measurements in combination with averaged spectrum of the surface natural gamma spectroscopy may provide the drill cuttings depth matching information. The NMR measurements on the drill cuttings may assist with determining the volume of the drill cuttings or other irregular shaped borehole materials.

Fast measurement of the volume of a borehole material (e.g. drill cuttings or micro-cores) is a necessary element of a high throughput borehole material characterization (e.g. via NMR or natural gamma spectroscopy) needed to support a drilling process. Indeed, the measurement time needs to be adequate to the drilling rate of penetration (ROP). For example, the rate 100 ft/h with a desired spatial resolution of 5 feet (one sample per five feet of drilling) would require the total measurement time, including the sample volume measurement, of less than 3 min per sample.

Figure 8:
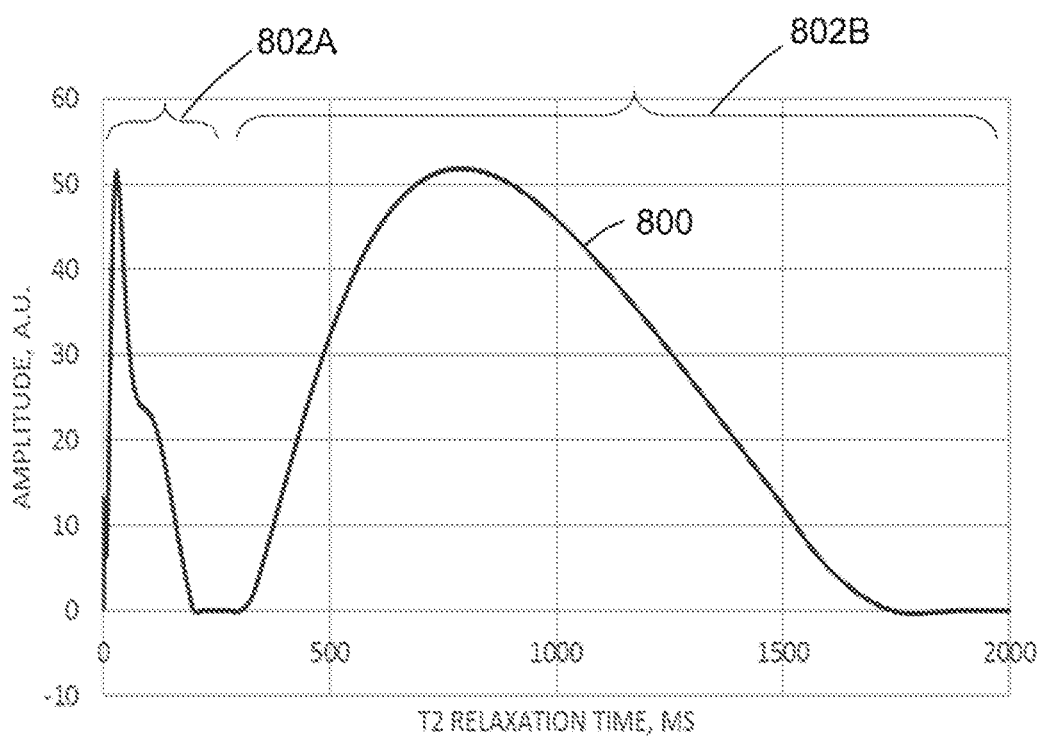
FIG. 8 illustrates a method of volume measurement for irregular shaped samples.

FIG. 8 illustrates a method of volume measurement of borehole materials containing irregular shaped pieces of rock like drill cuttings or micro-cores. Presented in FIG. 8 is an exemplary distribution 800 of the transversal relaxation times in a drill cuttings sample with the drilling fluid filling the space between the cuttings pieces. The faster fraction 802A of the relaxation times distribution corresponds to the fluids inside the pores of the cuttings pieces. It characterizes the type of fluids and the wettability of the pore surface in a preserved fraction of the porous space. The slow relaxation fraction 802B represents the drilling fluid filling the space between the cuttings pieces. If the sample container is filled completely with the cuttings and the drilling fluid, then the volume of the cuttings present in the sample can be calculated by subtracting the total volume of fluids in the sample from the volume of the sample container. The total volume of fluid can be determined via calibrated NMR measurement: the volume is proportional to the total area under the NMR relaxation curve 800. Then the following equation can be used to calculate the volume of the rock presented in the sample $$V_{cuttings} = V_{container} - \frac{S_{sample}}{S_{fluid\_sample}} \cdot V_{fluid\_sample} \quad (4)$$

In the equation (4): $V_{cuttings}$ is the volume of cuttings, $V_{container}$ is the volume of the sample container, $S_{sample}$ is the area under the transversal relaxation distribution curve 800 proportional to total amount of fluids in the sample, $S_{fluid\_sample}$ is the area under the transversal relaxation time distribution curve measured on the drilling fluid sample and $V_{fluid\_sample}$ is the volume of the drilling fluid sample (preferably the same as the volume $V_{container}$ of the sample container).

It is beneficial in some cases to determine the weight of the cuttings. The weight can be calculated as $$W_{cuttings} = W_{total} - \frac{S_{sample}}{S_{fluid_{sample}}} \cdot V_{fluid_{sample}} \cdot \rho_{fluid}, \quad (5)$$

where $W_{total}$ is the total weight of the sample and $\rho_{fluid}$ is the density of the drilling fluid.

The volume and the weight of the cuttings may be used to normalize the NMR data and non-NMR data. For example, it can be used to normalize the natural gamma spectroscopy data (e.g. K, U, Th signals that can be related to the rock type). The natural gamma spectroscopy may require measurement of the K, U, Th background signals present in the drilling fluid sample and further subtraction of a fraction of these signals corresponding to the volume of the drilling fluid in the cuttings sample from the K, U, Th signals acquired on the cuttings sample.

NMR data related to the cuttings structure correspond to the faster fraction 802A of the relaxation time distribution. The combined NMR and natural gamma spectroscopy data on cuttings (and micro-cores) can be used to assess petrophysical parameters related to lithology, pore structure and intra-pore fluids properties of rock formations.

Based on the equations (4) and (5) the density of the drill cuttings ($W_{cuttings}/V_{cuttings}$) may be assessed giving additional information about the rock type.

While the invention has been described with respect to a limited number of embodiments, those skilled in the art, having benefits of this disclosure, will appreciate that other embodiments can be devised which do not depart from the scope of invention as disclosed herein.

What I claim as my invention is:

1. An apparatus for nuclear magnetic resonance (NMR) measurement on a sample of a borehole material, comprising:
    a sensor unit including a magnet assembly to generate a static magnetic field and an antenna assembly to generate a radio-frequency (RF) magnetic field; the sensor unit being configured to determine a sensitivity volume affected by the NMR measurement, the determining of the sensitivity volume including selecting a fraction of the sample by at least one of (i) using a gradient of the static magnetic field and (ii) using a spatial localization of the RF magnetic field;
    an acquisition unit being configured to acquire NMR data from the sensitivity volume by applying at least one sequence of RF pulses followed by a waiting time, and detecting signals in response to the at least one sequence of RF pulses; and
    a processing unit being configured to process the acquired NMR data from the sensitivity volume to calculate a relaxation time distribution, the relaxation time distribution having a parameter related to at least one petrophysical parameter.

2. The apparatus of claim 1, further comprising: a sample transfer unit being configured to provide relative displacement between the sample of the borehole material and the sensitivity volume.

3. The apparatus of claim 2, wherein the sample of the borehole material comprises an at least one of (i) a whole core sample, (ii) a stack of back-to-back placed core samples, (iii) a stack of back-to-back placed core plugs, and (iv) an unconsolidated continuous sample.

4. The apparatus of claim 2, further comprising an auxiliary sensor to measure at least one of (i) weight, (ii) volume, and (iii) density of the borehole material in the sample of the borehole material.

5. The apparatus of claim 2, wherein the acquisition unit and the sample transfer unit are configured to provide switching between a first position of the sensitivity volume and at least one second position of the sensitivity volume, the switching using at least one of (i) changing frequency of the RF pulses, (ii) changing the static magnetic field, and (iii) changing the sample position relative to the sensor unit, wherein the acquisition unit is configured to acquire the NMR data from the sensitivity volume at the second position of the sensitivity volume during the waiting time following the RF pulse sequence used to acquire NMR data from the sensitivity volume at the first position of the sensitivity volume.

6. The apparatus of claim 1, wherein using the gradient of the static magnetic field includes selecting the gradient of the static magnetic field in relation to an RF pulse width.

7. The apparatus of claim 1, wherein the at least one petrophysical parameter includes one of (i) a porosity, (ii) a pore size distribution, (iii) a concentration of bound fluids, (iv) a concentration of free fluids, and (v) a wettability of the pore surface.

8. The apparatus of claim 1, wherein the at least one petrophysical parameter is interpreted jointly with at least one of (i) a downhole measurement data and (ii) a surface spectroscopic measurement data that do not include NMR data.

9. A system for an automated nuclear magnetic resonance (NMR) measurement on a sample of a borehole material, comprising:
    a sensor unit including a magnet assembly to generate a static magnetic field and an antenna assembly to generate a radio-frequency (RF) magnetic field; the sensor unit being configured to determine a volume of the borehole material to be investigated affected by the NMR measurement, the determining of the sensitivity volume including selecting a fraction of the sample by at least one of (i) using a gradient of the static magnetic field, (ii) using a spatial localization of the RF magnetic field, (iii) selecting a frequency bandwidth of the RF magnetic field in relation to the gradient of the static magnetic field, and (iv) selecting the gradient of the static magnetic field in relation to the frequency bandwidth of the RF magnetic field;
    a sample transfer unit being configured to automatically provide relative displacement between the sample of the borehole material and the sensor unit;

an acquisition unit being configured to acquire NMR data from the volume of the borehole material to be investigated, the acquisition unit including a processor; and one or more machine-readable media having program code executable by the processor to cause generation of at least one sequence of RF pulses followed by a waiting time, and the one or more machine-readable media being configured to detect signals in response to the sequence of RF pulses, the generation of the at least one sequence of RF pulses being performed in synchronization with the relative displacement between the sample of the borehole material and the sensor unit.

10. The system of claim 9, wherein the processor detects the volume of the borehole material to be investigated by filling a sample container with a hydrogen containing fluid, determining the volume of the fluid based on an NMR signal relaxation spectrum, and subtracting the volume of the fluid from a volume of the container.

11. The system of claim 9, wherein the NMR data is acquired adaptively using repeating the sequence of RF pulses and stacking the detected signals until one of (i) a desired signal-to-noise ratio of the data is reached and (ii) a time limit set for the measurement is reached.

12. The system of claim 9, wherein the sample transfer unit is configured to automatically transferring a calibration sample to perform an on-the-fly calibration, the calibration sample content having a known hydrogen index.

13. The system of claim 9, wherein the sample of the borehole material includes a whole core sample, the selecting the fraction of the sample by using the gradient of the static magnetic field includes acquiring a magnetic resonance image of at least a part of the sample of the borehole material.

14. The system of claim 9, wherein one or more machine-readable media have a program code executable by the processor causes switching between a first position of the volume of the borehole material to be investigated and at least one second position of the volume of the borehole material to be investigated, the switching using at least one of (i) changing frequency of the RF pulses, (ii) changing the static magnetic field and (iii) changing the sample position relative to the sensor unit, the acquiring NMR data from the volume of the borehole material to be investigated at the second position during waiting time following the RF pulse sequence used to acquire NMR data from the volume of the borehole material to be investigated at the first position.

15. One or more non-transitory machine-readable media comprising program code executable by a processor to cause the processor to:

control relative displacement between a sample of a borehole material and a nuclear magnetic resonance (NMR) sensor unit, the NMR sensor unit comprising sources of a static magnetic field and a radio frequency (RF) magnetic field; and generate an at least one sequence of pulses of the RF magnetic field and detecting by an NMR sensor unit signals in response to the sequence of pulses of the RF magnetic field, the generation being performed in synchronization with the relative displacement, the NMR sensor unit configured to determine a sensitivity volume affected by the NMR measurement, the determining of the sensitivity volume including selecting a fraction of the sample by at least one of (i) using a gradient of the static magnetic field and (ii) using a spatial localization of the RF magnetic field.

16. The one or more non-transitory machine-readable media of claim 15, wherein the program code executable by the processor causes the processor to select the sensitivity volume by one of (i) selecting a frequency bandwidth of the RF magnetic field in relation to a gradient of the static magnetic field and (ii) selecting the gradient of the static magnetic field in relation to the frequency bandwidth of the RF magnetic field.

17. A method for high-throughput nuclear magnetic resonance (NMR) measurement on a sample of a borehole material, comprising:

generating a radio frequency (RF) magnetic field in a form of sequences of RF pulses having a waiting time between the sequences of RF pulses;

generating a static magnetic field, determining a sensitivity volume of the sample of the borehole material affected by the NMR measurement based on the RF magnetic field and the static magnetic field;

switching between at least two sensitivity volumes during the waiting time to enable at least two-region NMR measurements in one measurement cycle and therefore increase the measurement throughput of the method; and repeating the generating the radio frequency magnetic field, generating the static field, and the switching between at least two sensitivity volumes during a corresponding waiting time at different positions on the sample of a borehole material to produce a one-dimensional image of the NMR relaxation properties of the sample of a borehole material.

\* \* \* \* \*